United States Patent
Im et al.

(10) Patent No.: US 8,785,237 B2
(45) Date of Patent: Jul. 22, 2014

(54) METHOD OF FORMING VARIABLE RESISTANCE MEMORY DEVICE

(75) Inventors: Dong-Hyun Im, Hwasung (KR); Hyeonggeun An, Hwasung (KR); Sunglae Choi, Hwasung (KR); Ik Soo Kim, Hwasung (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 125 days.

(21) Appl. No.: 12/625,816

(22) Filed: Nov. 25, 2009

(65) Prior Publication Data

US 2010/0129995 A1    May 27, 2010

(30) Foreign Application Priority Data

Nov. 25, 2008   (KR) .......................... 10-2008-0117494

(51) Int. Cl.
*H01L 21/06* (2006.01)
(52) U.S. Cl.
USPC ........................................... 438/102; 438/95

(58) Field of Classification Search
USPC .................................................. 438/102, 95
See application file for complete search history.

(56) References Cited

U.S. PATENT DOCUMENTS

| | | | |
|---|---|---|---|
| 2005/0124155 A1* | 6/2005 | Brooks et al. | 438/654 |
| 2006/0172067 A1 | 8/2006 | Ovshinsky et al. | |
| 2007/0008773 A1* | 1/2007 | Scheuerlein | 365/161 |
| 2007/0097739 A1* | 5/2007 | Happ et al. | 365/163 |
| 2008/0020564 A1 | 1/2008 | Bae et al. | |
| 2008/0277641 A1* | 11/2008 | Stanton | 257/4 |
| 2008/0316804 A1* | 12/2008 | Jeong et al. | 365/163 |
| 2009/0148649 A1* | 6/2009 | Shi et al. | 428/64.4 |
| 2009/0174519 A1* | 7/2009 | Mikawa et al. | 338/20 |

FOREIGN PATENT DOCUMENTS

| | | |
|---|---|---|
| KR | 1020070101361 A | 10/2007 |
| KR | 100780865 B1 | 11/2007 |
| KR | 1020080028544 | 4/2008 |

* cited by examiner

*Primary Examiner* — Jae Lee
(74) *Attorney, Agent, or Firm* — Volentine & Whitt, PLLC

(57) ABSTRACT

A method of forming a variable resistance memory device includes forming an opening in an insulating layer, and forming a variable resistance layer by filling the opening with an antimony rich antimony-tellurium compound.

18 Claims, 10 Drawing Sheets

METHOD OF FORMING VARIABLE RESISTANCE MEMORY DEVICE

CROSS-REFERENCE TO RELATED APPLICATIONS

This U.S. non-provisional patent application claims priority under 35 U.S.C. §119 of Korean Patent Application No. 10-2008-0117494, filed on Nov. 25, 2008, the disclosure of which is hereby incorporated herein by reference in its entirety as if set forth fully herein.

BACKGROUND

The present inventive concept relates to memory devices. More particularly, the present inventive concept relates to methods of forming variable resistance memory devices.

Variable resistance memory devices may have a nonvolatile characteristic such that their stored data are retained even when their power supplies are interrupted. An element of phase change material for storing data may provide the nonvolatile characteristic in a unit cell of a variable resistance memory device. In this respect, the phase change material can assume a plurality of states, e.g., crystalline and amorphous, having different resistivities. In particular, phase change material in a crystalline state may have a low resistivity compared with phase change material in an amorphous state.

Variable resistance memory devices including phase change material are in the limelight and studies on variable resistance memory devices are being actively performed.

SUMMARY

A method of forming a variable resistance memory device, according to an aspect of the inventive concept, includes forming an opening in an insulating layer on a substrate; and forming a variable resistance layer filling the opening, wherein the variable resistance layer comprises an antimony rich antimony-tellurium compound.

A method of forming a variable resistance memory device, according to another aspect of the inventive concept, includes forming an opening in an insulating layer on a substrate; and depositing amorphous material, comprising antimony and tellurium, into the opening.

DETAILED DESCRIPTION OF THE EMBODIMENTS

Figure 1:
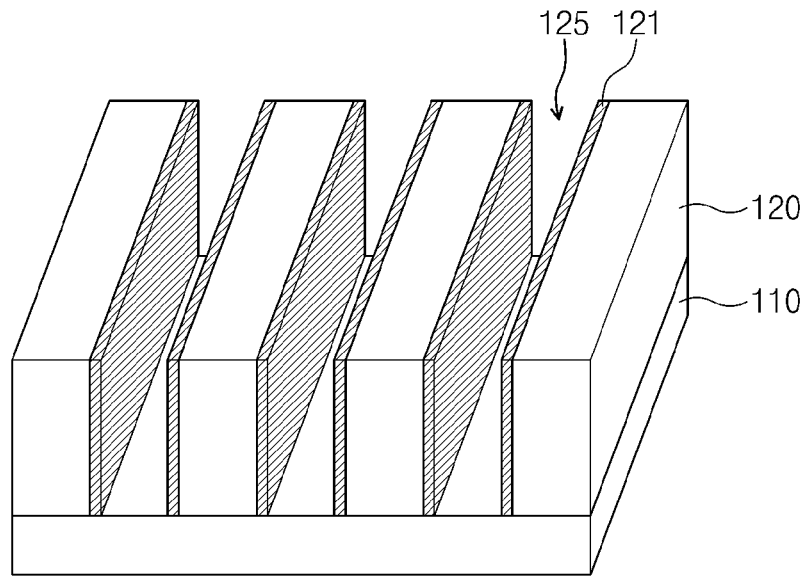
FIGS. 1 through 8 are each a perspective view of a substrate and together illustrate an embodiment of a method of forming a variable resistance memory device in accordance with the inventive concept.

The present invention now will be described more fully hereinafter with reference to the accompanying drawings. In the drawings, the size and relative sizes of layers and regions may be exaggerated for clarity. Also, like numbers are used to designate like elements throughout the drawings. Furthermore, in the specification various types of conductors may be described under the general term "electrode", i.e., the term "electrode" is to be construed in its broadest reasonable sense given the field to which the inventive concept relates.

An example of a method of forming a variable resistance memory device as embodied in accordance with the present inventive concept will now be described in detail with reference to FIGS. 1 through 8.

Referring first to FIG. 1, a first mold insulating layer 120 is formed on a substrate 110 to define a first trench 125. The substrate 110 may be a semiconductor substrate and may include a conductive region and/or an insulating region. The first mold insulating layer 120 may comprise an oxide or a nitride. For example, the first mold insulating layer 120 may include an oxide of an element of Group IV. The first mold insulating layer 120 and the first trench 125 can be formed by forming an insulating layer on the substrate 110 and then patterning the insulating layer using processes that are known in the art per se.

Next, a preliminary lower electrode layer 121 is formed on the sides of the first trench 125. The preliminary lower electrode layer 121 can be formed by forming a conductive layer on the substrate 110 that conforms to the topography of first mold insulating layer 120 and the first trench 125, and then by anisotropically etching the conductive layer. The anisotropic etching may be performed until a top surface of the substrate 110 and/or a top surface of the first mold insulating layer 120 is/are exposed.

Also, a buffer layer of an insulating material may be optionally formed over the entirety of the conductive layer before it is anisotropically etched. For example, the buffer layer may comprise a nitride or an oxide. Such a buffer layer would cover the conductive layer to minimize damage to an edge portion of the conductive layer during the anisotropic etching. In this case, although some of the buffer layer would be removed by the etching process, the etching process would leave the buffer layer along the sides of the first trench 125.

Figure 2:
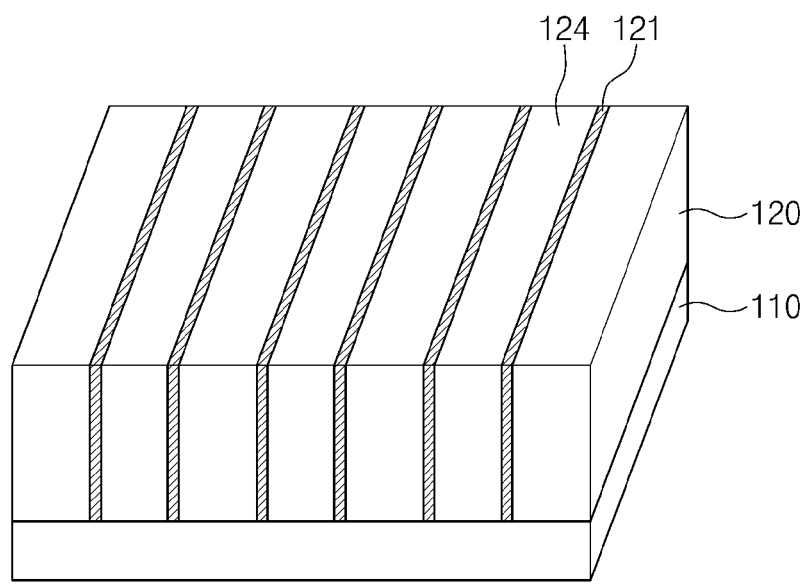

Referring to FIG. 2, a second mold insulating layer 124 is formed to fill the first trench 125 lined by the preliminary lower electrode layer 121. The second mold insulating layer 124 may comprise a nitride or an oxide. Also, in the case in which a buffer layer is formed on the preliminary lower electrode layer 121, the second mold insulating layer 124 may be of the same material as the buffer layer. In any case, the second mold insulating layer 124 can be formed by depositing insulating material on the substrate 110 to such a thickness that the resulting layer of insulating material fills the trench 125 and covers the first mold insulating layer 120, and then by planarizing the insulating layer until the top surface of the preliminary lower electrode layer 121 is exposed.

Figure 3:
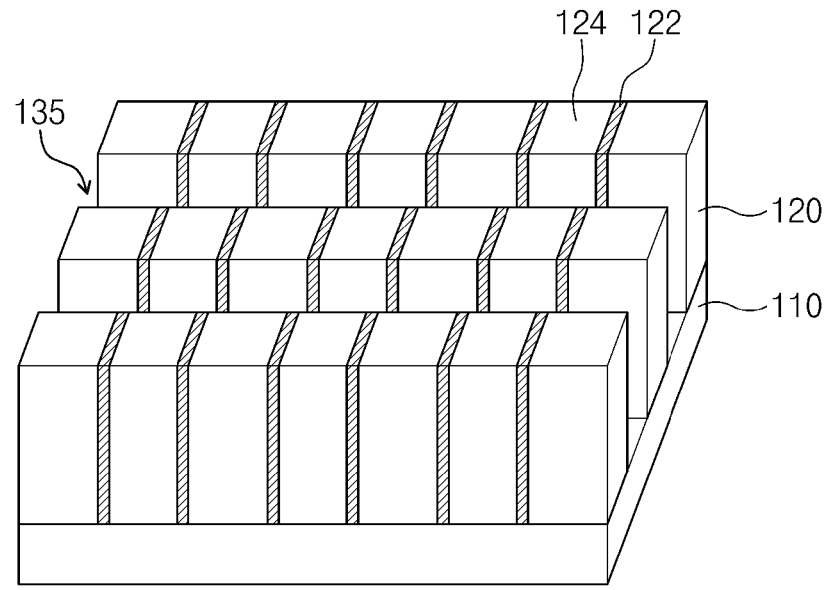

Referring to FIG. 3, a second trench 135 crossing the first trench 125 is formed in the first and second mold insulating layers 120 and 124 on the substrate 110. In the embodiment as shown in FIG. 3, the second trench 135 extends longitudinally in a direction which is orthogonal to the direction in which first trench 125 extends longitudinally, i.e., the first and second trenches 123 and 133 are perpendicular to each other. Alternatively, the first and second trenches 123 and 133 may cross each other at, and thereby subtend, an acute angle. The second trench 135 may be formed by forming a mask pattern on the first and second mold insulating layers 120 and 124, and then by anisotropically etching the first and second mold insulating layers 120 and 124 using the mask pattern as an etch mask.

In any case, the preliminary electrode layer 121 is divided by the anisotropic etching process to form a lower electrode layer 122 of a plurality of discrete (spaced apart) electrode segments.

As described above, the lower electrode layer is formed by a process in which a first trench is formed in an insulating layer, a conductive layer is formed on sides of the first trench, a second insulating layer is formed to fill the first trench, and then a second trench is formed in the first and second insulating layers across the first trench. However, the inventive concept is not so limited. That is, the lower electrode layer 122 may be formed by a process different from that described above.

Figure 4:
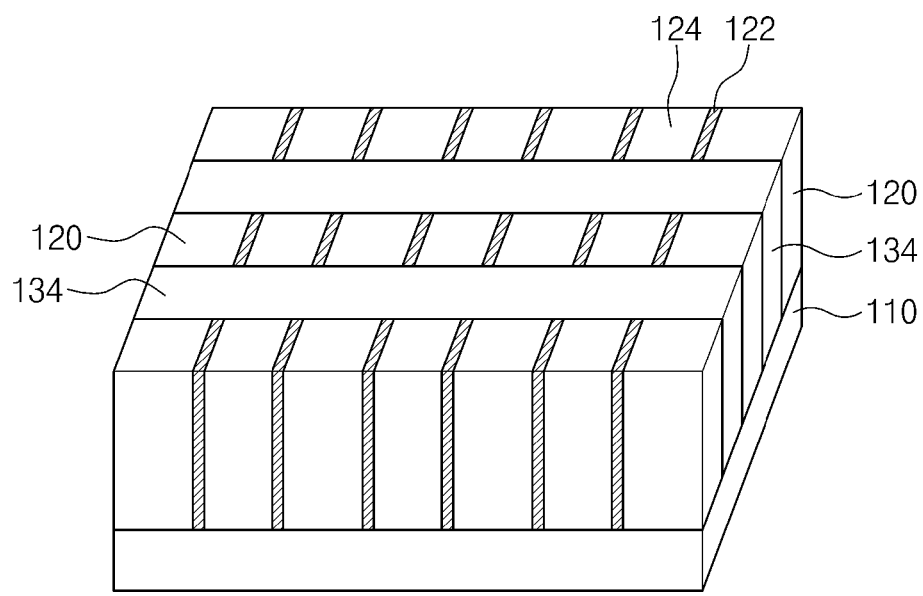

Referring to FIG. 4, a third mold insulating layer 134 is formed to fill the second trench 135. The third mold insulating layer 134 thus electrically isolates the electrodes of the lower electrode layer 122 from each other. The third mold insulating layer 134 may comprise a nitride or an oxide. For example, the third mold insulating layer 134 may be a nitride of an element in Group IV. The third mold insulating layer 134 can be formed by depositing insulating material on the structure shown in FIG. 3 to such a thickness as to fill the first and second trenches 125 and 135 and cover the first and second mold insulating layers 120 and 124, and then by planarizing the resulting layer of insulating material down to the top surface of the lower electrode layer 122.

Figure 5:
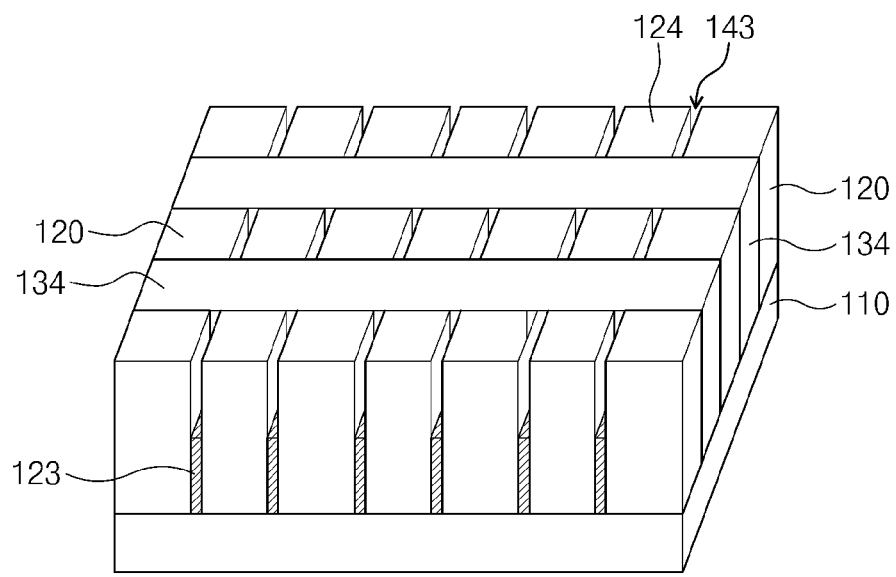

Referring to FIG. 5, the lower electrode layer 122 is then recessed by, for example, wet etching the lower electrode layer 112, to form a pattern of lower electrodes 123. The top surfaces of the lower electrodes 123 are thus situated below the top surfaces of the first, second and third mold layers 120, 124 and 134. The lower electrodes 123 may serve as electrodes or contacts of a variable resistance memory cell.

In any case, openings 143 are delimited by the first, second and third mold layers 120, 124 and 134 and the lower electrode layer 122. More specifically, the opening 143 has sides defined by internal sidewalls of the first, second and third mold layers 120, 124 and 134 and a bottom defined by the top surface of a respective lower electrode 123. The sectional shape of the opening 143, in a plane parallel to the top surface of substrate 110, is one that is elongated. The shape may be that of an oval or a parallelogram including a rectangle. The sectional shape of the opening 143 is dictated (designed for) by forming the first and second trenches 123 and 133 in predetermined directions, and/or by the parameters selected for the etching of the lower electrode layer 122. In any case, the pattern of lower electrodes 123 and the openings 143 can be formed to have very fine widths.

Figure 6:
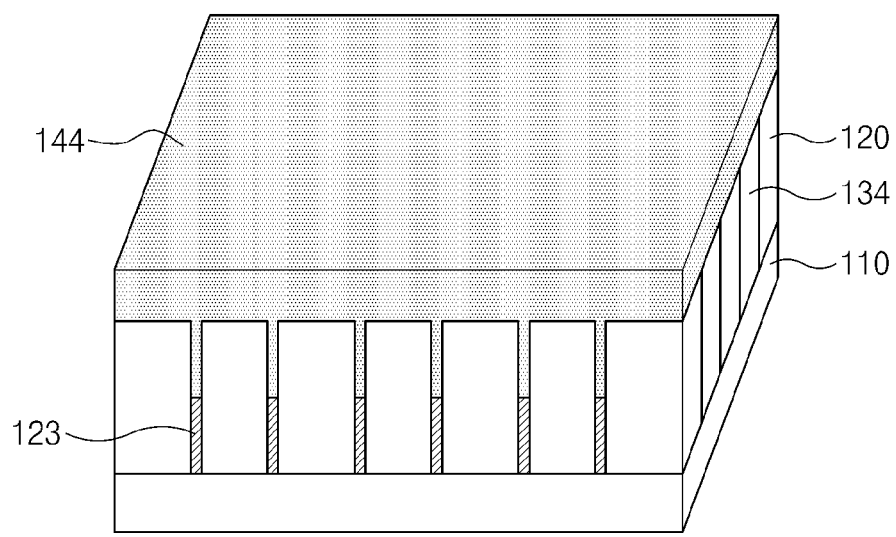

Referring to FIG. 6, the openings 143 are filled with variable resistance material 144 of a certain composition. Thus, the variable resistance material 144 can be formed by, for example, an atomic layer deposition (ALD) process or a chemical vapor deposition (CVD) process. However, the variable resistance material 144 may be formed by other known methods of forming a layer in which the ratio of elements constituting the layer can be controlled.

In the present embodiment, the layer of variable resistance material 144 is formed by an atomic layer deposition (ALD) process. An example of this process will be described in detail with reference to FIGS. 5 and 6 and the chart of FIG. 9.

First, the structure shown in FIG. 5, i.e., the substrate 110 having the openings 143 formed thereon, is loaded into a processing chamber. Next, first source gas is injected into the chamber. The first source gas comprises antimony or tellurium. In particular, the first source gas may be an organic or inorganic metal compound including antimony or tellurium. In addition, the first source gas may be injected into the chamber together with carrier gas having a very low reactivity with the first source gas. For example, such carrier gas may be an inert gas selected from the group consisting of argon (Ar) and helium (He), and nitrogen ($N_2$).

The first source gas diffuses throughout the openings 143 and is thus adsorbed at the internal surfaces delimiting the openings 143 and the top surfaces of the first, second and third mold insulating layers 120, 124 and 134. Alternatively, a first metal is separated from the first source gas and is adsorbed at the internal surfaces delimiting the openings 143 and at the top surfaces of the first, second and third mold insulating layers 120, 124 and 134. A purging gas may be further injected into the chamber before and/or after the first source gas is injected. The purging gas can discharge from the chamber that portion of the first source gas and/or the first metal which is not adsorbed.

Second source gas is then injected into the chamber and thus diffuses throughout the openings 143. The second source gas may be an organic metal compound or an inorganic metal compound of a second metal. The second metal is the other of antimony and tellurium, i.e., that which is not included in the first source gas. The second source gas may be injected into the chamber together with a carrier gas. The carrier gas may be gas having a very low reactivity with the second source gas. For example, the carrier gas may be an inert gas selected from the group consisting of argon (Ar) and helium (He), and nitrogen ($N_2$).

A capping gas may also be injected into the processing chamber so as to diffuse throughout the openings to control a reaction between the first metal and the second metal. The capping gas may comprise at least one gas selected from the group consisting of $NH_3$, $H_2$, $N_2H_4$, $SiH_4$, $B_2H_6$, $O_2$, $O_3$ and $H_2O$. More specifically, the capping gas caps the first metal and/or the second metal or the capping gas caps the first source gas and/or the second source gas.

For example, the capping gas caps the first metal adsorbed at the surfaces delimiting the openings 143 and at the upper surfaces of the first, second and third mold insulating layers 120, 124 and 134 to lower the rate of a reaction between the first metal and the second metal. In this respect, atoms or an atomic group of the capping gas may become a substituent in the first metal of the first source gas, i.e., the capping gas may combine with the first metal. Alternatively, the capping gas can be electrostatically attracted to the first metal to cap the first metal.

Figure 9:
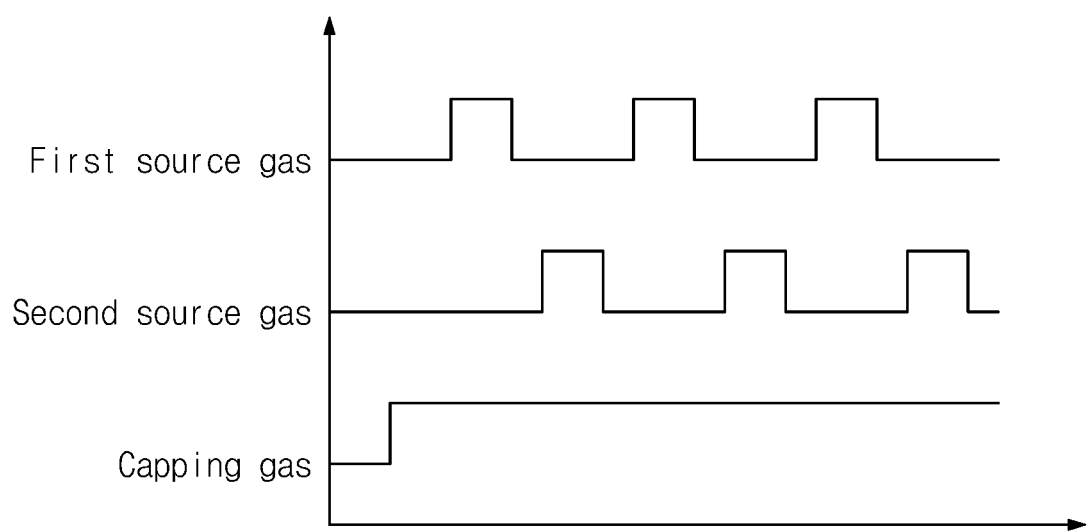
FIG. 9 is a timing chart of the injection of gas into a processing chamber in an atomic layer deposition (ALD) process which is used in the method illustrated in FIGS. 1 through 8.

The capping gas may be injected into the processing chamber along with or independently of the source gases. Also, as depicted in FIG. 9, the capping gas may be continuously injected into the processing chamber during the entire time in which the source gases are being injected.

As was mentioned above, the variable resistance material 144 is formed by a method in which the ratio of elements constituting the material can be controlled. In this regard, the ratio of elements making up the variable resistance material 144 may be controlled by the capping gas. As an alternative, the ratio of elements constituting the variable resistance material 144 may be controlled by controlling the relative amounts of the first and the second source gases injected into the processing chamber and/or the frequency at which (number of times) each of the first and the second source gases is injected into the processing chamber. In any case, in the present embodiment, the variable resistance material 144 is formed of antimony-rich (Sb-rich) antimony-tellurium.

In the present specification, an antimony-rich antimony-tellurium compound means that the ratio of antimony in the antimony-tellurium compound is relatively high. That is, antimony-telluride in a stoichiometric phase is $Sb_2Te_3$. Thus, the antimony rich antimony-tellurium compound formed according to the inventive concept is one which satisfies the formula $Sb_xTe_{1-x}$, wherein X is larger than 0.4 and preferably is larger than or equal to 0.5.

Such an antimony rich antimony-tellurium compound has been found to have a superior gap-filling characteristic compared to stoichiometric phase antimony-tellurium compounds. More specifically, in the case of an antimony-tellurium compound in which the ratio of antimony is greater than that which exists in a corresponding compound at the stoichiometric phase, the former exists in an amorphous state and thus has a superior gap-filling characteristic. This means that the openings 143 can be readily and completely filled with the variable resistance material even if the openings are very narrow. That is, the variable resistance material 144 has minimal defects, e.g., voids, when it is formed in the openings 143. Therefore, additional processes typically used to cure defects when narrow gaps are filled are rendered unnecessary.

Furthermore, dopants may be added to the variable resistance material 144. The dopants may comprise at least one element selected from the group consisting of nitrogen, carbon and oxygen. To this end, the dopants may be injected into the processing chamber with the source gases and/or the capping gas as the variable resistance material 144 is being formed. Alternatively, the dopants may be added to the variable resistance material 144 by injecting the dopants into the processing chamber independently of the source gases and the capping gas while the variable resistance material 144 is being formed. As another alternative, the dopants may be added to the variable resistance material 144 by a process performed before and/or after the variable resistance material 144 is formed.

The reset resistance of the variable resistance material 144 can be increased by the dopants. In addition, the dopants can mitigate a so-called resistance drift phenomenon when a variable resistance memory cell including the variable resistance material 144 is programmed.

Figure 7:
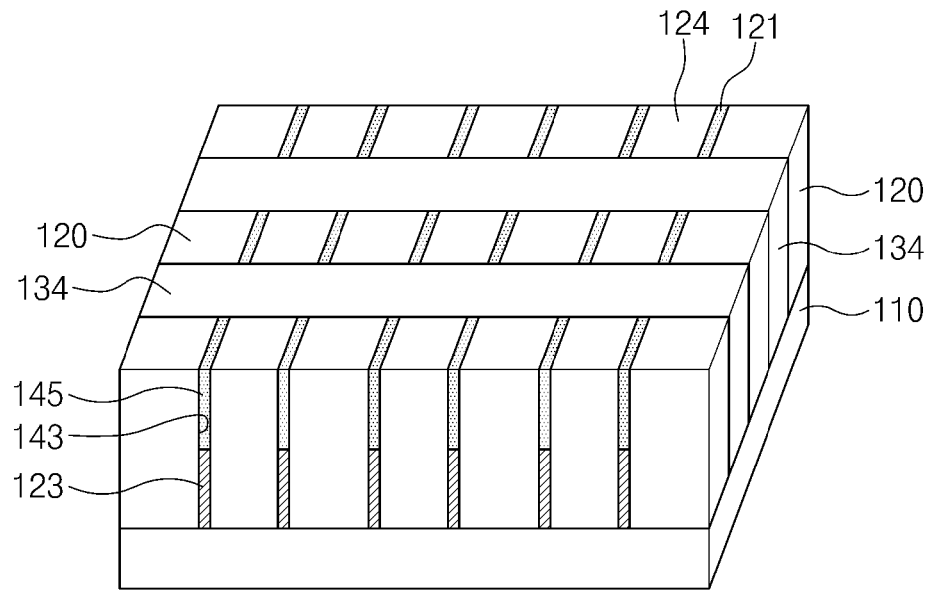

Referring to FIG. 7, the variable resistance material 144 is planarized to form a variable resistance pattern 145. The planarization may be performed down to the top surfaces of the first, second and third mold insulating layers 120, 124 and 134. The planarization may be performed by a chemical mechanical polishing (CMP) process or an etch back process but any other suitable planarization process may be used instead.

As a result of the planarization process, in the present embodiment, enough of the variable resistance pattern 145 remains to fill the openings 143. That is, the variable resistance pattern 145 occupies the entire space delimited by the upper surfaces of lower electrodes 123 and the internal surfaces of the first, second and third mold insulating layers 120, 124 and 134. Thus, the top surface of each segment of the variable resistance pattern 145 may be rectangular or may have the shape of an oval based on the sectional shape of the openings 143 as described above.

Figure 8:
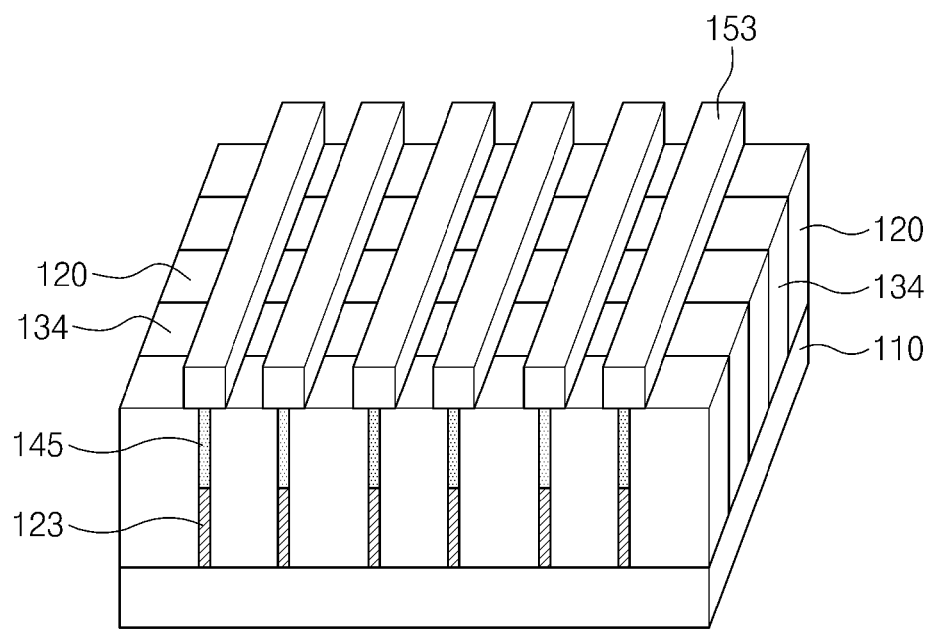

Referring to FIG. 8, next, an upper electrode pattern 153 may be formed on the variable resistance pattern 145. More specifically, the upper electrode pattern 153 may be formed by forming a layer of conductive material over the variable resistance pattern 145, and then by patterning the layer of conductive material.

As shown in FIG. 8, each electrode of the upper electrode pattern 153 may extend longitudinally in the aforementioned first direction. i.e., perpendicular to the direction in which the second trenches 135 extend longitudinally. Alternatively, the electrodes of the upper electrode pattern 153 may each have a linear shape extending in a direction different to that depicted in FIG. 8. As another alternative, the electrodes of the upper electrode pattern 153 may each have the shape of an island connected to a respective one of the segments of the variable resistance pattern 145. The upper electrode pattern 153 may also cover the entire upper surface of the variable resistance pattern 145.

FIG. 8 thus also depicts one example of a variable resistance memory device in accordance with the inventive concept.

Referring to FIG. 8, the variable resistance memory device thus has a substrate 110, and a lower electrode pattern 123, an upper electrode pattern 153 and a variable resistance pattern 145 interposed between the lower electrode pattern 123 and the upper electrode pattern 153 on the substrate 110. The variable resistance memory device also has insulating layers 120, 124 and 134 having inner walls surrounding the variable resistance pattern 145 and the lower electrode pattern 123.

The top surface of the variable resistance pattern 145 in this embodiment is coplanar with the top surfaces of the insulating layers 120, 124 and 134. Also, the top surface of each of the individual segments of the variable resistance pattern 145 is rectangular but, as mentioned above, the surface may have the shape of an oval or a parallelogram.

Furthermore, the variable resistance pattern 145 is of an antimony-rich antimony-tellurium compound. The formula of the antimony rich antimony-tellurium compound satisfies $Sb_xTe_{1-x}$, wherein x is larger than or equal to 0.4. Preferably, x is lager than or equal to 0.5. The variable resistance pattern 145 may exist in the opening 143 in an amorphous state or in a crystalline state. The variable resistance pattern 145 may further include dopants. The dopant may be of at least one element selected from the group consisting of nitrogen, carbon and oxygen.

The upper electrode pattern 153 is electrically connected to the variable resistance pattern 145. Each electrode of the upper electrode pattern 153, as depicted in FIG. 8, may cover a plurality of discrete segments of the variable resistance pattern 145. Alternatively, each electrode of the upper electrode pattern 153 may cover only a respective one of the segments of the variable resistance pattern 145.

FIGS. 10 through 17 illustrate various applications of the inventive concept, namely, electronics that can employ a variable resistance memory device.

Figure 10:
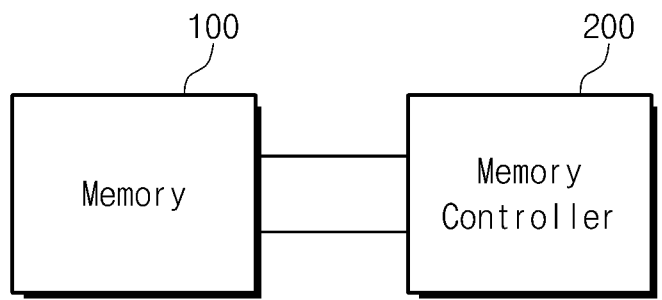
FIGS. 10 through 17 are each a schematic diagram of a device or system that may employ a variable resistance memory device manufactured in accordance with the inventive concept.

FIG. 10 depicts an electronic device that includes a memory 100 and a memory controller 200. The memory 100 may have a memory cell array that includes an embodiment of a variable resistance memory device in accordance with the inventive concept. The memory controller 200 provides an input signal controlling the operation of the memory 100. For example, the memory controller 200 can provide an instruction and an address signal. The memory controller 200 can receive a control signal that provides information to the memory controller 200 as to how to control the memory 100.

Figure 11:
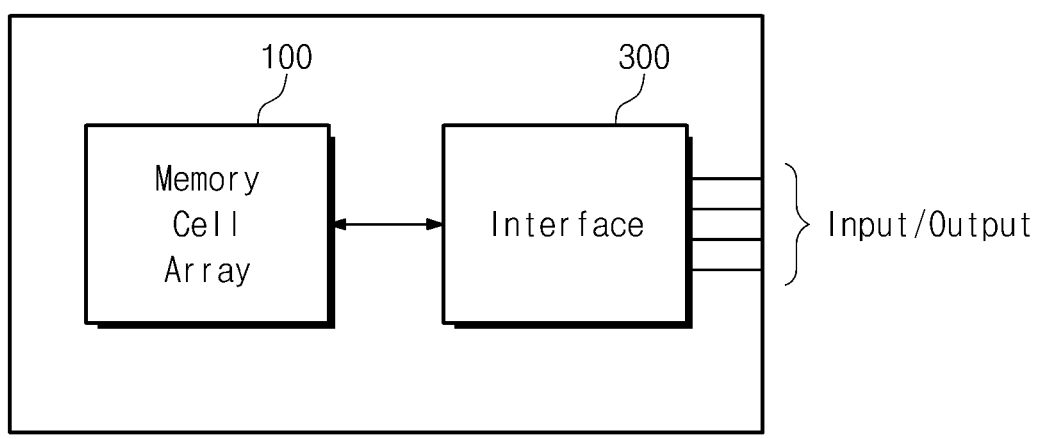

FIG. 11 depicts an electronic device includes a memory 100 similar to that of the device shown in FIG. 10, and an interface 300 to which the memory 100 is connected. The interface 300 provides an input signal to the memory 100. For example, the interface 300 can input an instruction and an address signal to the memory 100. Thus, the memory 100 is controlled by a signal generated outside the device.

Figure 12:
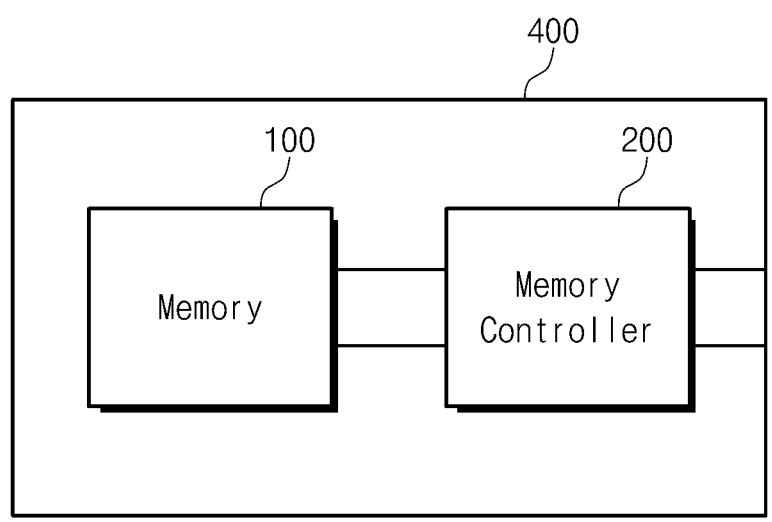

FIG. 12 depicts an electronic device similar to the device of FIG. 10 except that the memory 100 and the controller 200 part of a memory card 400. For example, the memory card 400 is a standard card employed by consumer electronic devices such as digital cameras, personal computers or the like. The memory controller 200 controls the memory 100 based on a control signal which the memory card 400 receives from an external device.

Figure 13:
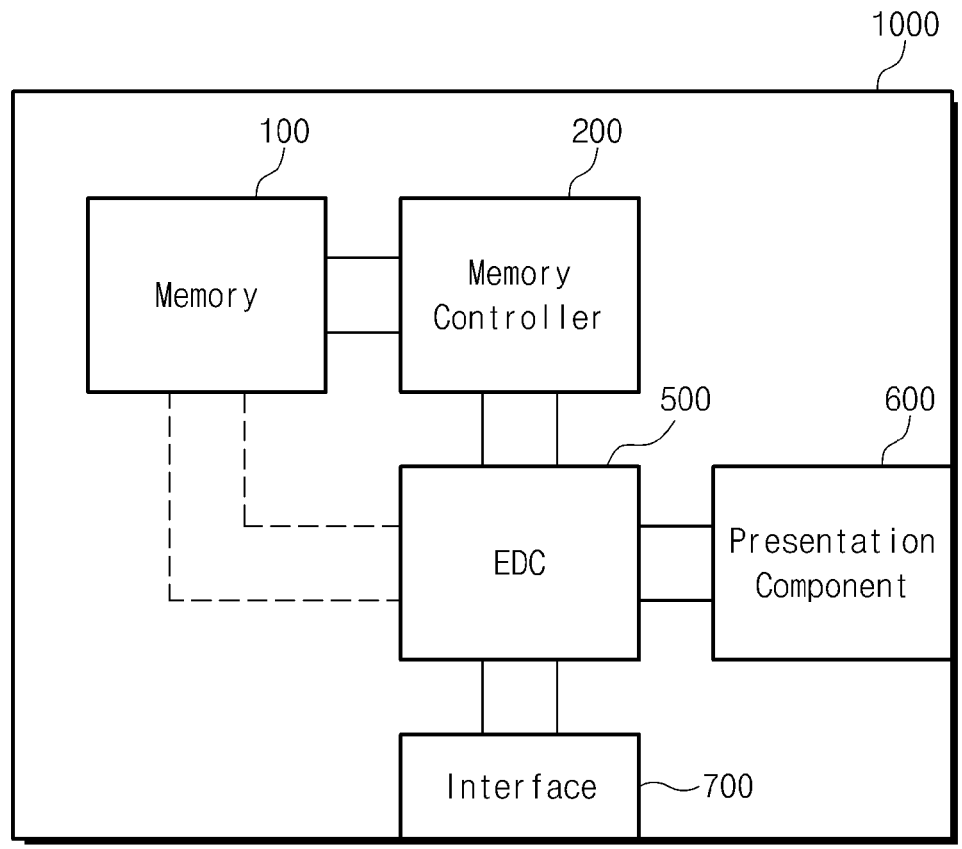

FIG. 13 depicts a portable electronic device 1000 such as an MP3 player, a video player, a video/audio player. As depicted in FIG. 13, the portable device 1000 includes a memory 100 and a memory controller 200 similar to the devices shown in FIGS. 10 and 11. Thus, the memory 100 includes an embodiment of a variable resistance memory device in accordance with the inventive concept. The portable device 1000 also includes an encoder/decoder (EDC) 500, a presentation component 600 (display) and an interface 700. Data may be transmitted between the memory 100 and the encoder/decoder (EDC) 500 by way of the memory controller 200. As represented by the dashed lines, data may also be transmitted directly between the memory 100 and the encoder/decoder (EDC) 500.

The EDC 500 can encode data which will be stored in the memory 100. For example, the EDC 500 can encode audio data and store the encoded audio data in the memory 100. Alternatively, the EDC 500 can encode MPEG video data and store the encoded MPEG video data (e.g., MPEG3, MPEG4) in the memory 100. The EDC 500 can include a plurality of encoders encoding different types of data in accordance with different data formats. For example, the EDC 500 may include an MP3 encoder for encoding audio data and an MPEG encoder for encoding video data. The EDC 500 can also decode data outputted from the memory 100. For example, the EDC 500 can perform an MP3-decoding of audio data outputted from the memory 100. The EDC 500 can also perform an MPEG-decoding (e.g., MPEG3, MPEG4) of video data outputted from the memory 100. The EDC 500 can include a plurality of decoders decoding different types of data in accordance with different data formats. For example, the EDC 500 may include an MP3 decoder for decoding audio data and an MPEG decoder for decoding video data. In other applications, the EDC 500 may be replaced with only a decoder. In this case, for example, data that is already encoded can be transfers to such a decoder to be decoded, and then the decoded data is transmitted to the memory controller 200 and/or the memory 100.

The EDC 500 receives data for encoding or data already encoded by way of the interface 700. The interface 700 may conform to a well known standard (e.g., USB or firewire). Data supplied from the memory 100 may be outputted by way of the interface 700. The presentation component 600 is for outputting the data, decoded by the memory 100 and/or the EDC 500, to the end user. For example, the presentation component 600 may comprise a display screen that displays visual or video data, a speaker jack or the like.

Figure 14:
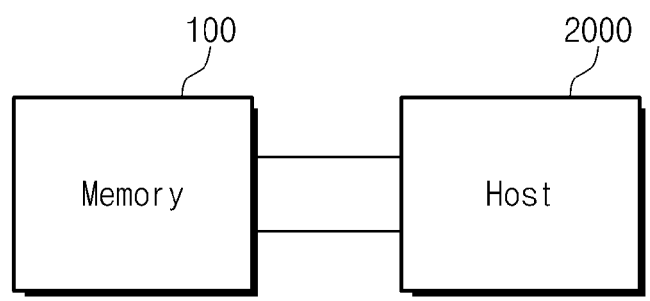

FIG. 14 depicts an electronic device including a memory 100 and a host system 2000 to which the memory 100 is connected. As was the case with the devices described above, the memory 100 includes an embodiment of a variable resistance memory device in accordance with the inventive concept. The host system 2000 may be a processing system such as a personal computer, a digital camera or the like. The memory 100 may, for example, be a component which can be attached to and removed from the host system 2000 (e.g., a memory card, a USB memory or a solid state driver). The host system 2000 may generate a signal for controlling an operation of the memory 100. For example, the host system 2000 may generate an instruction and an address signal.

Figure 15:
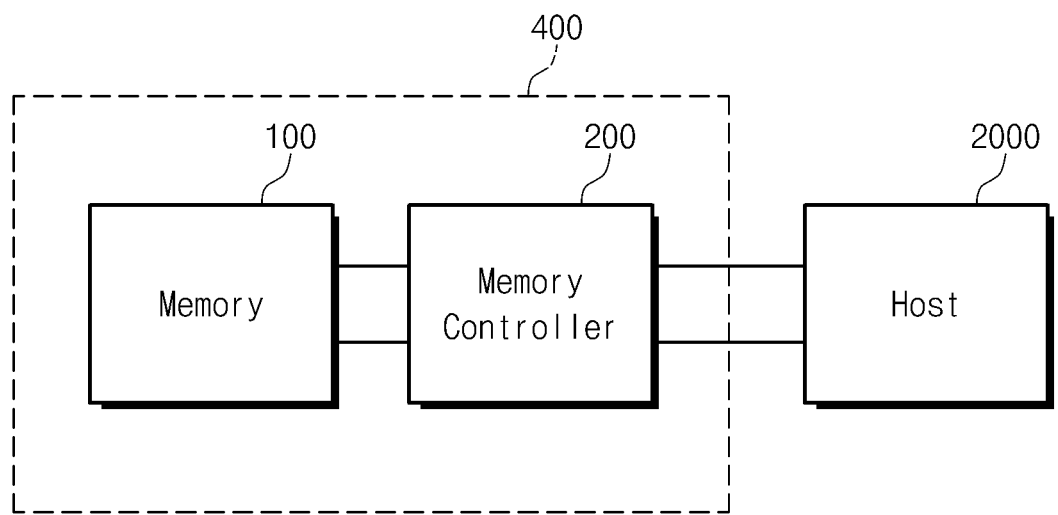

FIG. 15 depicts an electronic device including a variable resistance memory device in accordance with another example of an application of the present inventive concept. In this example, a host system 2000 is connected to a memory card 400. The host system 2000 provides a control signal to the memory card 400 that operates the memory controller 200 to control an operation of the memory 100.

Figure 16:
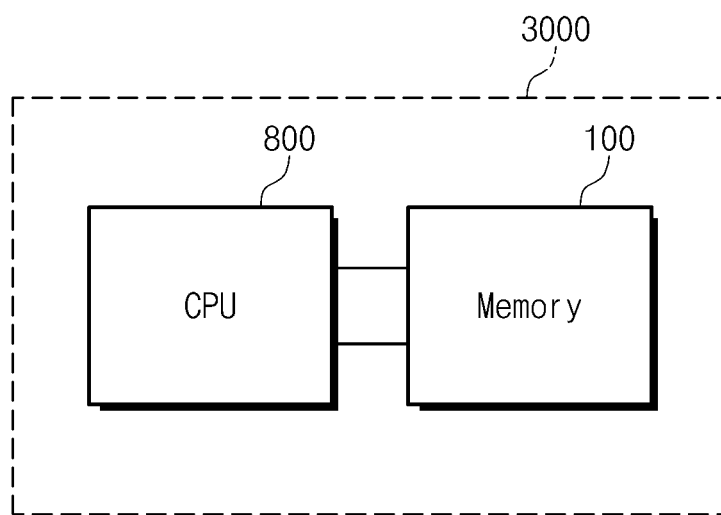

FIG. 16 depicts a computer system 3000 including a variable resistance memory device as another example of an application of the present inventive concept. The computer system 3000 includes a memory 100 and a central processing unit (CPU) 800 to which the memory 100 is connected. The computer system 3000 may be a personal computer, a personal data assistant or the like. The memory 100 may be connected to the central processing unit (CPU) 800 through a bus.

Figure 17:
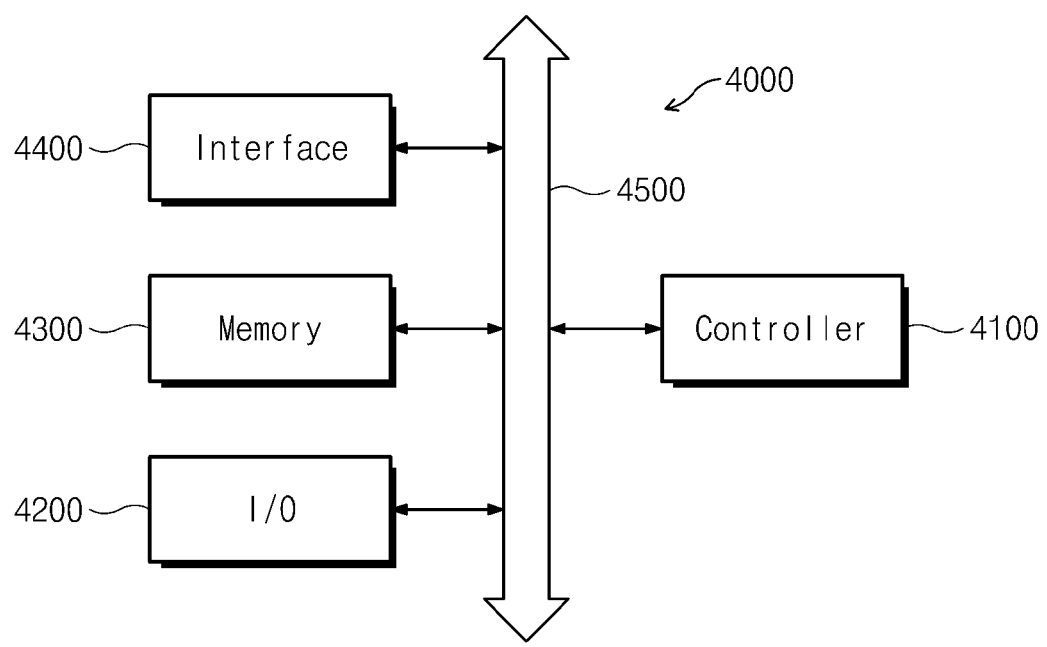

FIG. 17 depicts an electronic device 4000 including a variable resistance memory device in accordance with another example of the present inventive concept. The device 4000 may be a mobile system such as a PDA, a portable computer, a web tablet, a wireless phone, a mobile phone, a digital music player, a memory card or other system capable of transmitting and/or receiving data. The device 4000 includes a controller 4100, an input/output device 4200 such as a keyboard, a display, a memory 4300 and an interface 4400. These components are connected to each other through a bus 4500.

The controller 4100 may include a microprocessor, a digital processor, a microcontroller or a processor. The memory 4300 can store an instruction executed by data and/or the controller 4100. The interface 4400 can be used to transmit data to another system (e.g., a communications network) or receive data from another system (e.g., a communications network).

As described above, a method of fabricating a variable resistance memory device according to the inventive concept includes the filling of a gap with antimony rich antimony-tellurium to provide variable resistance material of the device (electrodes whose resistivity can change). Antimony rich antimony-tellurium has a superior gap-filling characteristic. Therefore, the variable resistance material can completely fill an opening having a small width. Thus, a highly variable resistance memory device can be provided.

Finally, embodiments of the inventive concept have been described herein in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A method of forming a variable resistance memory device comprising:

forming electrically insulating material having an opening therein on an upper surface of a substrate, wherein the opening has depth in a direction perpendicular to the upper surface of the substrate, length in a first direction parallel to the upper surface, and width in a second direction parallel to the upper surface and perpendicular to the first direction, and the opening is oblong in a bird's eye view in the first direction parallel to the upper surface of the substrate; and filling the opening completely with material, comprising antimony and tellurium, while the material is in an amorphous state to thereby form a variable resistance layer, in the opening, which is also oblong in a bird's eye view in the first direction parallel to the upper surface of the substrate, wherein the filling of the opening completely comprises depositing an antimony-tellurium compound, comprising $Sb_xTe_{1-x}$ (0.5≤x<1), on the substrate to form a layer of the compound that is buried in the opening.

2. The method of claim 1, wherein the filling of the opening to form the variable resistance layer comprises:
   causing a first source gas comprising antimony to diffuse throughout the opening;
   causing a second source gas comprising tellurium to diffuse throughout the opening; and
   controlling a reaction between the antimony and tellurium with a capping gas.

3. The method of claim 2, wherein the capping gas comprises at least one gas selected from the group consisting of $NH_3$, $H_2$, $N_2H_4$, $SiH_4$, $B_2H_6$, $O_2$, $O_3$ and $H_2O$.

4. The method of claim 1, further comprising doping the variable resistance layer with at least one element selected from the group consisting of nitrogen, carbon and oxygen.

5. A method of forming a variable resistance memory device comprising:
   forming a first mold insulating layer defining a first trench extending longitudinally in a first direction, on a substrate;
   forming a lower electrode layer along a side of the first trench;
   forming a second mold insulating layer that fills the first trench while the lower electrode layer is disposed along the side of the first trench;
   forming a second trench that extends longitudinally across the first trench in a second direction by patterning the first and second mold insulating layers and the lower electrode layer;
   forming a third mold insulating layer that fills the second trench, the first, second and third mold insulating layers constituting a layer of electrically insulating material;
   forming a recess in the patterned lower electrode layer; and
   depositing amorphous material, comprising antimony and tellurium, into the recess to thereby form a variable resistance layer, comprising an antimony-tellurium compound, in the recess.

6. The method of claim 5, wherein the compound is antimony rich.

7. The method of claim 1, wherein the compound is antimony rich.

8. A method of forming a variable resistance memory device comprising:
   forming a first mold insulating layer defining a first trench extending longitudinally in a first direction, on a substrate;
   forming a lower electrode layer along a side of the first trench;
   forming a second mold insulating layer that fills the first trench while the lower electrode layer is disposed along the side of the first trench;
   forming a second trench that extends longitudinally across the first trench in a second direction by patterning the first and second mold insulating layers and the lower electrode layer;
   forming a third mold insulating layer that fills the second trench, the first, second and third mold insulating layers constituting a layer of electrically insulating material;
   forming a recess in the patterned lower electrode layer; and
   forming a variable resistance layer, comprising an antimony rich antimony-tellurium compound, in the recess.

9. The method of claim 8, wherein the forming of the variable resistance layer comprises:
   causing a first source gas comprising antimony to diffuse throughout the recess;
   causing a second source gas comprising tellurium to diffuse throughout the recess; and
   controlling a reaction between the antimony and tellurium with a capping gas.

10. The method of claim 9, wherein the capping gas comprises at least one gas selected from the group consisting of $NH_3$, $H_2$, $N_2H_4$, $SiH_4$, $B_2H_6$, $O_2$, $O_3$ and $H_2O$.

11. The method of claim 8, further comprising doping the variable resistance layer with at least one element selected from the group consisting of nitrogen, carbon and oxygen.

12. The method of claim 8, further comprising planarizing the variable resistance layer down to an upper surface of the insulating layer.

13. The method of claim 1, wherein internal sidewalls of the insulating material delimit sides of the opening, and the depositing of the antimony-tellurium compound forms the compound on and in contact with the internal sidewalls of the insulating material.

14. The method of claim 13, wherein the forming of the insulating material comprises forming at least one of an oxide layer and a nitride layer on the substrate, such that the antimony-tellurium compound contacts sidewall surfaces of the oxide or nitride layer.

15. The method of claim 1, further comprising forming a lower electrode layer of electrically conductive material on the substrate, and
   wherein the forming of the electrically insulating material having an opening therein and the forming of the lower electrode layer comprise:
   forming, on the substrate, a structure comprising a layer of electrically insulating material and a preliminary lower electrode layer extending in the layer of insulating material, and wherein the preliminary lower electrode layer comprises a segment of electrically conductive material that is elongated in the first direction and has an upper surface that is exposed at an upper surface of the layer of electrically insulating material, and
   etching the segment of the preliminary lower electrode layer to form said opening.

16. The method of claim 2, wherein the capping gas is continuously injected into a chamber during the entire time in which the first source gas and the second gas are being injected in the chamber.

17. The method of claim 1, wherein the filling of the opening comprises depositing the antimony-tellurium compound to form a blanket layer of the compound that covers the insulating material and the opening in the insulating material.

18. The method of claim 1, wherein the forming electrically insulating material having an opening therein on an upper surface of a substrate comprises:
   forming a trench in a layer of insulating material;
   forming a preliminary electrode layer along a side of the trench;
   filling what remains of the trench with another layer of insulating material; and
   etching back the preliminary electrode layer to simultaneously form a lower electrode on the substrate and the opening atop the lower electrode.

* * * * *